United States Patent [19]
Uno

[11] Patent Number: 5,955,918
[45] Date of Patent: Sep. 21, 1999

[54] BURST MODE DIGITAL DATA AMPLIFIER CIRCUIT UNIT AND AMPLIFIER CIRCUIT

[75] Inventor: Hitoshi Uno, Kanagawa, Japan

[73] Assignee: Matsushita Electric Industrial Co., Ltd., Osaka, Japan

[21] Appl. No.: 08/997,895

[22] Filed: Dec. 24, 1997

[30] Foreign Application Priority Data

Dec. 27, 1996 [JP] Japan .................................. 8-349810

[51] Int. Cl.[6] .............................. H03F 1/02; H03F 3/45; H03F 3/08
[52] U.S. Cl. .................. 330/9; 327/307; 330/69; 330/308
[58] Field of Search .................. 330/9, 11, 69, 330/59, 252, 308; 250/214 A, 214 C; 327/307; 359/189; 375/317, 318, 319

[56] References Cited

U.S. PATENT DOCUMENTS

| | | |
|---|---|---|
| 5,025,456 | 6/1991 | Ota et al. . |
| 5,475,342 | 12/1995 | Nakamura et al. . |
| 5,498,993 | 3/1996 | Ohtsuka et al. . |
| 5,612,810 | 3/1997 | Inami et al. .......................... 350/59 X |

*Primary Examiner*—Steven J. Mottola
*Attorney, Agent, or Firm*—McDermott, Will & Emery

[57] ABSTRACT

An amplifier circuit unit is composed of an offset compensation circuit for equalizing and issuing a DC potential in data input period of one input signal of differential input signals, and a DC potential in data input period of other input signal, and an amplitude limiting amplifier circuit for receiving a differential output signal from this offset compensation circuit as an input signal, and issuing to a differential output terminal as a differential output signal kept in a constant output signal amplitude while amplifying in a linear region. This amplifier circuit unit is connected in cascade in plural stages as required, and is applied to an amplifier circuit of an optical receiving circuit and others.

8 Claims, 18 Drawing Sheets

(a) Input signal in amplitude
limiting amplifier circuit (b) Output data (a) Input signal in amplitude
limiting amplifier circuit (b) Output data (a) Input signal in amplitude limiting amplifier circuit (b) Output data (a) Input signal in amplitude limiting amplifier circuit (b) Output data

BURST MODE DIGITAL DATA AMPLIFIER CIRCUIT UNIT AND AMPLIFIER CIRCUIT

BACKGROUND OF THE INVENTION

The present invention relates to an amplifier circuit unit for amplifying a burst signal, in particular, for use in an optical receiving circuit, and an amplifier circuit comprising plural amplifier circuit units.

In an optical digital communication system, an optical receiving circuit for amplifying an attenuated signal is indispensable. This optical receiving circuit is required to have functions for converting an optical signal into a current signal by a photo diode, further converting this current signal into a voltage signal, and amplifying to an amplitude of voltage so as to be distinguished logically.

A conventional optical receiving circuit is composed as shown in a block diagram in FIG. 16, in which an optical signal h v is converted into a current signal Iin by a photo detector PD (photo diode), and this current signal Iin is put into a pre-amplifier circuit 3. This pre-amplifier circuit 3 converts the current signal Iin into a voltage signal t. The voltage signal t is passed through a capacitor C to be rid of low frequency components, and becomes a voltage signal u, which is fed into an amplitude limiting amplifier circuit 41 of a main amplifier circuit 4. The amplitude limiting amplifier circuit 41 receives a fixed voltage v from a voltage source E as a threshold, and amplifies the voltage signal u, and issues a pulse signal data row w that can be distinguished logically.

That is, in the conventional amplifier circuit, cutting off the low frequency components of the input signal, the DC level was made constant regardless of the input signal level, and the fixed threshold was used as the reference for amplifying the signal voltage by the amplitude limiting amplifier circuit 41.

Recently, an optical communication system using a burst mode digital data signal is being studied, and high speed response when starting data input is required in the optical receiving circuit.

In such prior art, however, high speed response upon start of data input and same code continuity tolerance cannot be satisfied at the same time.

FIG. 17A shows an input signal waveform (a) into the amplitude limiting amplifier circuit 41 when starting data input in the case of setting the capacitor C at small value and low band cut-off frequency at high value in FIG. 16, and FIG. 17B is an explanatory diagram of relation of output data waveform (b). FIG. 19A shows an input signal waveform (a) into the amplitude limiting amplifier circuit 41 when starting data input in the case of setting the capacitor C at large value and low band cut-off frequency at low value in FIG. 16, and FIG. 19B is an explanatory diagram of output data waveform (b). In FIG. 17A and FIG. 19A, in order that φ level may be issued in the no-signal input period, it is set so that the potential v may be lower than potential u at the time of no-signal input.

Comparing these waveforms, it is known that by setting the low band cut-off frequency at higher value, the DC level fluctuations are faster, the intermediate level of input data u can be brought closer to the fixed threshold level v in a shorter time, and the distortion and deterioration period upon data input start can be shortened.

FIG. 18A shows an input signal waveform (a) into the amplitude limiting amplifier circuit 41 in single continuity mode in the case of setting the capacitor C at small value and low band cut-off frequency at large value in FIG. 16, and FIG. 18B is a diagram showing an output data waveform (b). By contrast, FIG. 20A shows an input signal waveform (a) into the amplitude limiting amplifier circuit 41 in single continuity mode in the case of setting the capacitor C at large value and low band cut-off frequency at low value in FIG. 16, and FIG. 20B is an explanatory diagram of an output data waveform (b). In FIG. 18A and FIG. 20A, in order that φ level may be issued in the no-signal input period, it is set so that the potential v may be lower than potential u at the time of no-signal input.

In FIG. 18A, since the DC level fluctuations are fast, as shown in FIG. 18B, the logic of the output data is inverted in single continuity mode, whereas in FIG. 20A, DC level fluctuations are slow, it is known to have a high tolerance to same code continuity (FIG. 20B).

As explained herein, in the prior art, when the low band cut-off frequency is set higher, a high speed response characteristic is obtained upon start of data input, but, to the contrary, the same code continuity tolerance is lowered. Opposite to the above conditions, when the low band cut-off frequency is set lower, the same code continuity tolerance is enhanced but the high speed response characteristic upon start of data input is sacrificed, and such trade-off relation exists.

SUMMARY OF THE INVENTION

It is hence an object of the invention to solve the above problems of the prior at, and to present an amplifier circuit unit and an amplifier circuit capable of solving the contradictory problems of high speed response characteristic upon start of data input and same code continuity tolerance in a low band cut-off type optical receiving circuit.

To achieve the object, the amplifier circuit unit and the amplifier circuit of the invention are basically composed of an offset compensation circuit having two input terminals and two output terminals, and an amplitude limiting amplifier circuit having two input terminals and two output terminals connected thereto.

In the operating function of this circuit, first, peak values are detected in an input signal of positive phase supplied in one of the two input terminals of the offset compensation circuit and in an input signal of reverse phase supplied in other input terminal, and these peak values are held. Next, the difference between the positive phase input signal and the peak value held in this signal, and the difference between the reverse phase input signal and the peak value held in this signal are picked up, and taken out from two output terminals of the offset compensation circuit, and supplied into the amplitude limiting amplifier circuit. The amplitude limiting amplifier circuit holds the output amplitude constant while amplifying the two differential signal from the offset compensation circuit in a linear region, and obtains two output signals, respectively. Consequently, by comparing the two output signals in amplitude in a comparator, pulse signal data distinguishable logically is obtained.

In this circuit construction, by using peak value detecting and holding circuits of small time constant in charging and large time constant in discharging, both high speed response characteristic upon start of data input and same code continuity tolerance are realized.

DESCRIPTION OF THE PREFERRED EMBODIMENTS

Figure 1:
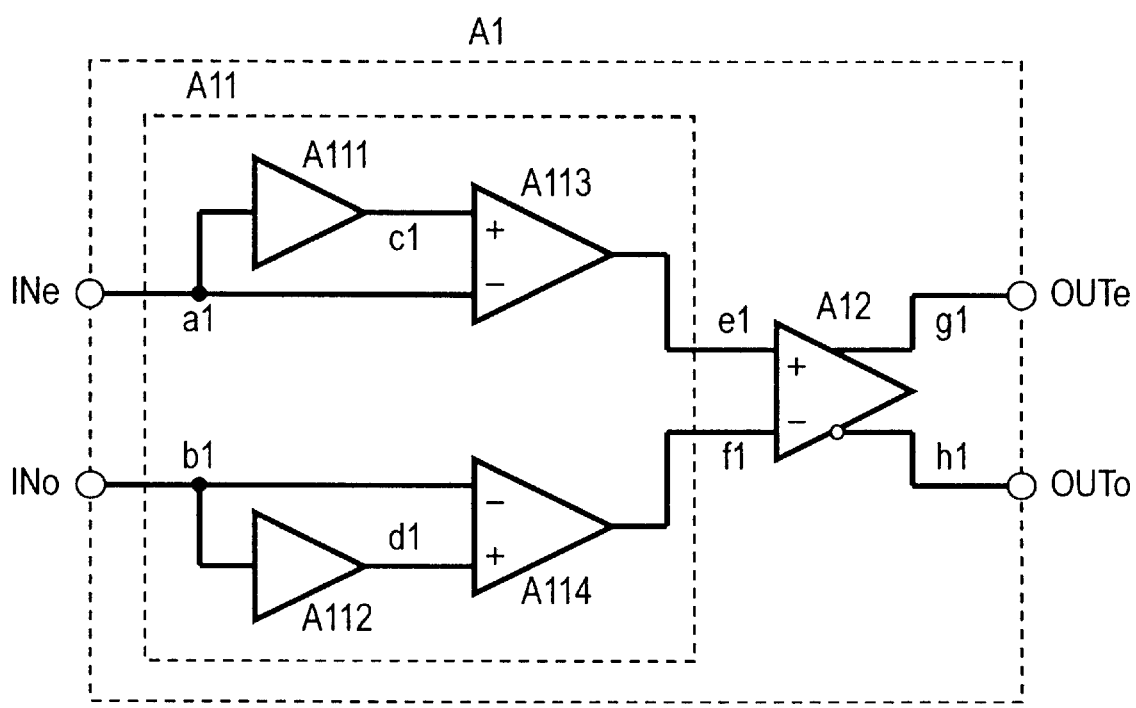
FIG. 1 is a circuit diagram of first basic amplifier circuit in an embodiment of the invention.

Referring now to the drawings, preferred embodiments of the amplifier circuit unit and the amplifier circuit using the amplifier circuit units of the invention are described below.

FIG. 1 is a circuit diagram showing a constitution of a basic amplifier circuit (amplifier circuit unit) A1 in a first embodiment according to the invention. This basic amplifier circuit A1 comprises an input terminal INe for receiving one signal of differential input signals, an input terminal INo for receiving other signal, an offset compensation circuit A11 for equalizing and issuing a DC value in data input period of the voltage signal entered in one input terminal INe and a DC value in data input period of the voltage signal entered in other input terminal INo, an amplitude limiting amplifier A12 for keeping constant the amplitude of the output signals while amplifying in a linear region by receiving the differential output signals from this offset compensation circuit A11 as input signals as shown in the diagram, an output terminal OUTe for delivering one signal of the differential output signals, and output terminal OUTo for delivering other signal.

In FIG. 1, the offset compensation circuit A11 is composed of a first peak detecting and holding circuit A111 for detecting and holding the peak value of the voltage signal entered in one input terminal INe, a first differential amplifier circuit A113 for issuing the difference of the value detected and held by this first peak detecting and holding circuit A111 and the voltage signal entered in one input terminal INe, and a second peak detecting and holding circuit A112 for detecting and holding the peak value of the voltage signal entered in other input terminal INo, and a second differential amplifier circuit A114 for issuing the difference of the value detected and held by this second peak detecting and holding circuit A112 and the voltage signal entered in other input terminal INo.

Figure 2:
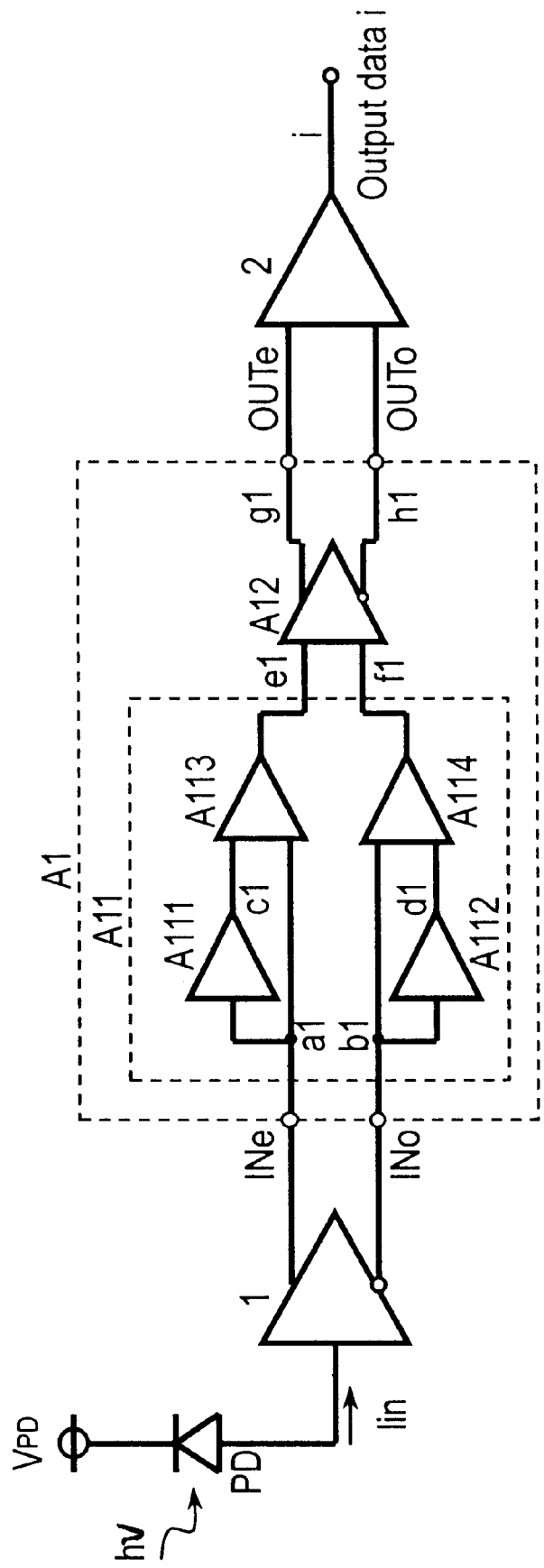
FIG. 2 is a circuit diagram showing a structural example of a optical receiving circuit using the first basic amplifier circuit of the invention.

A circuit diagram showing an example of constitution of an optical receiving circuit of the invention by using the basic amplifier circuit A1 shown in FIG. 1 is presented in FIG. 2.

In FIG. 2, a photo detector PD (photo diode) converts an optical signal h v into a current signal Iin, and this current signal Iin is issued to a differential output type pre-amplifier circuit 1. In the differential output type pre-amplifier circuit 1, the current signal Iin is converted into voltage signals of positive phase and its reverse phase and amplified.

Both output ends of the differential output type pre-amplifier circuit 1 are connected to the input terminals INe, INo of the basic amplifier circuit A1, and the output terminals OUTe, OUTo of the basic amplifier circuit 1 are connected to the input ends of a comparator 2.

The comparator 2 compares voltage values of voltage signals equal in the DC potential and in mutually opposite phase relation, being amplified and issued from the basic amplifier circuit A1, and issues a pulse signal data row that can be distinguished logically.

Figure 3A:
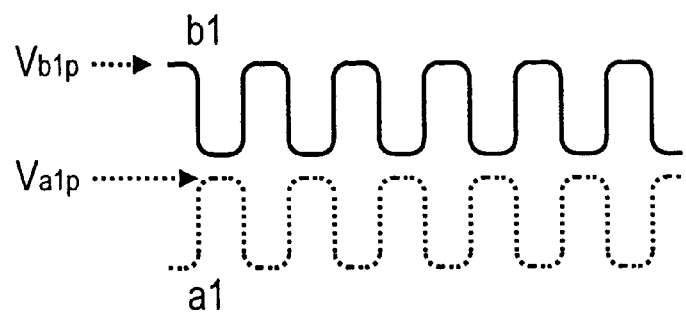
FIG. 3A to FIG. 3E are waveform diagrams showing signal waveforms of parts of the optical receiving circuit using the first basic amplifier circuit in the first embodiment of the invention.
Figure 3B:
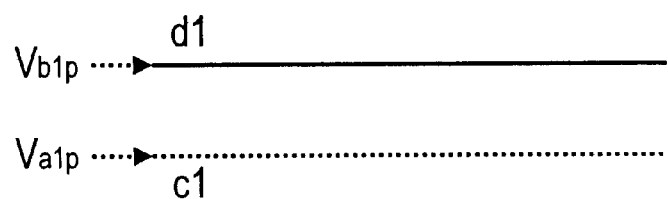
Figure 3C:
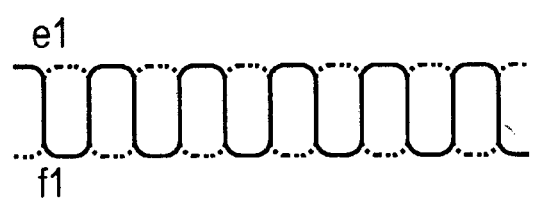
Figure 3D:
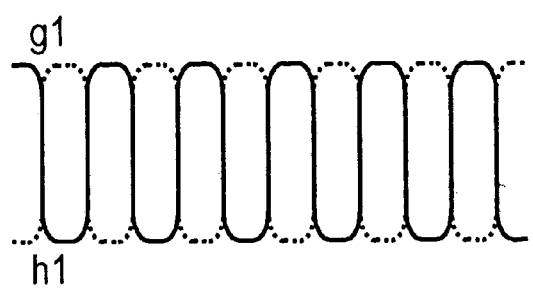
Figure 3E:
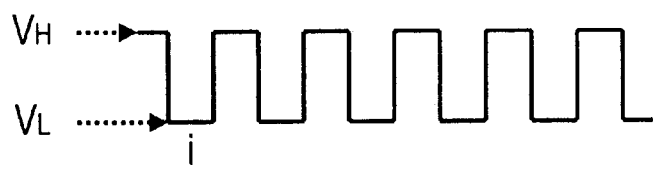

FIG. 3A to FIG. 3D show signal waveforms of parts of the basic amplifier circuit A1 in the optical receiving circuit in FIG. 2, and FIG. 3E is a waveform diagram showing an output signal waveform i of the comparator 2. FIG. 3A shows input signal waveforms a1 and b1 entered in the basic amplifier circuit A1, and their peak values Va1p, Vb1p. These peak values Va1p and Vb1p are respectively detected and held by the peak detecting and holding circuits A111, A112 in FIG. 2, and delivered to the differential amplifier circuits A113, A114, respectively. The output signal waveforms of the peak detecting and holding circuits A111, A112 are c1 and d1 in FIG. 3B.

The output signal waveforms e1 and f1 of the differential amplifier circuits A113 and A114 are signal waveforms equal in DC level and mutually opposite in phase, regardless of the input signal level, as shown in FIG. 3C. The signal waveforms e1 and f1 are amplified by the amplitude limiting amplifier circuit A12 to be signal waveforms g1 and h1 (FIG. 3D), and further voltage values are compared in the comparator 2 to be delivered as a pulse signal data row waveform i (FIG. 3E) that can be distinguished logically. In the signal waveform i shown in FIG. 3E, VH corresponds to logic 1, and VL to logic 0.

In the basic amplifier circuit (amplifier circuit unit) A1 in the first embodiment of the invention, by setting the charging time constant small and the discharging time constant large in the peak detecting and holding circuits A111 and A112, the high speed response characteristic upon start of data input and same code continuity tolerance can be both satisfied, and the conventional problem of trade-off relation can be solved.

In the basic amplifier circuit A1 in the optical receiving circuit in FIG. 2, an output offset voltage may occur due to fluctuations of elements caused during manufacture of integrated circuit, or deviation from ideal operation of each element for composing the basic amplifier circuit A1.

Figure 4A:
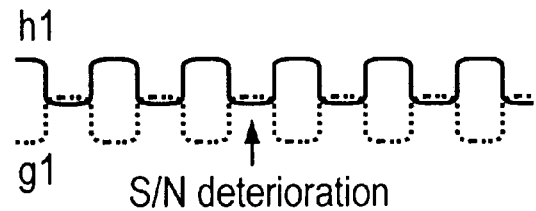
FIG. 4A(a), FIG. 4A(b), FIG. 4B(a), and FIG. 4B(b) are signal waveform diagram showing problems if a DC offset is present in the output of the basic amplifier circuit, in the optical receiving circuit using the basic amplifier circuit in the first embodiment.
Figure 4A:
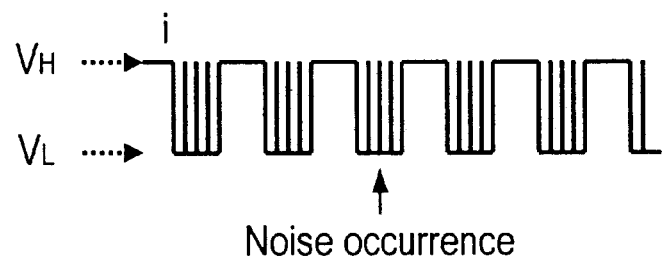
Figure 4B:
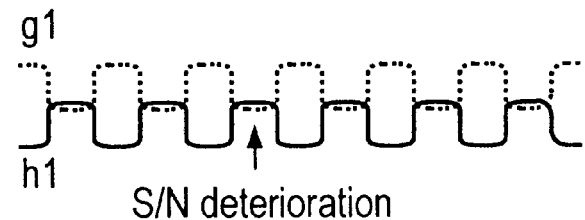
Figure 4B:
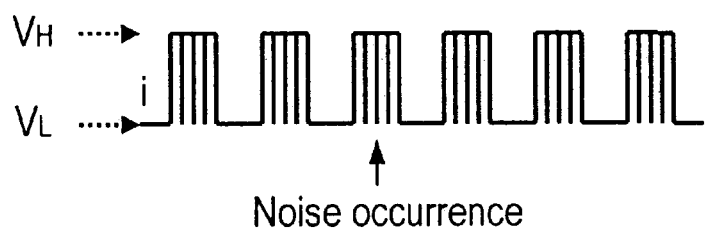

FIG. 4A(*a*) and FIG. 4A(*b*), FIG. 4B(*a*) and FIG. 4B(*b*) are waveform diagrams presenting such examples, showing output signal waveforms g1 and h1 of the basic amplifier circuit A1 when the input signal level is small, and output signal waveform i of the comparator 2 in this case.

FIG. 4A(*a*) shows signal waveforms when the DC potential of g1 is lower than the DC potential of h1, and in this case, as shown in FIG. 4A(*b*), noise due to deterioration of S/N is noted in logic 0 output.

On the other hand, FIG. 4B(*a*) shows signal waveforms when the DC potential of g1 is higher than the DC potential of h1, and in this case, as shown in FIG. 4B(*b*), noise due to deterioration of S/N is noted in logic 1 output.

Figure 5:
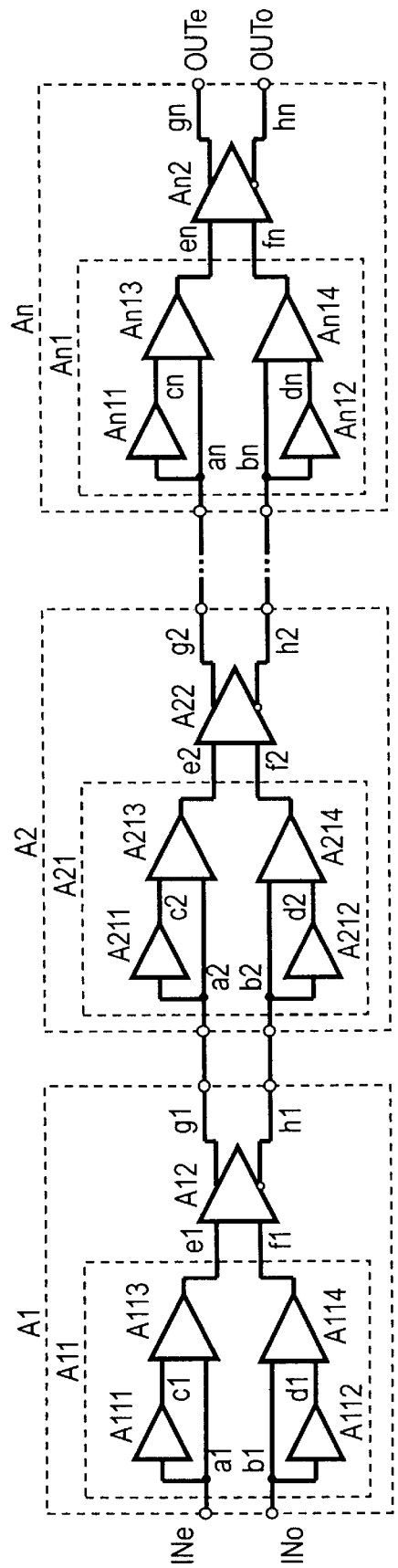
FIG. 5 is a circuit diagram showing an embodiment of a multi-stage amplifier circuit in a second embodiment and a fourth embodiment of the invention.

FIG. 5 is a circuit diagram of an amplifier circuit as a second embodiment of the invention for solving the problem of occurrence of deviation of the output offset voltage. The amplifier circuit shown in FIG. 5 is composed by cascade connection of n stages of plural basic amplifier circuits A1 to An constituted same as the basic amplifier circuit A1 in the first embodiment shown in FIG. 1, and is specifically used as follows.

Figure 6:
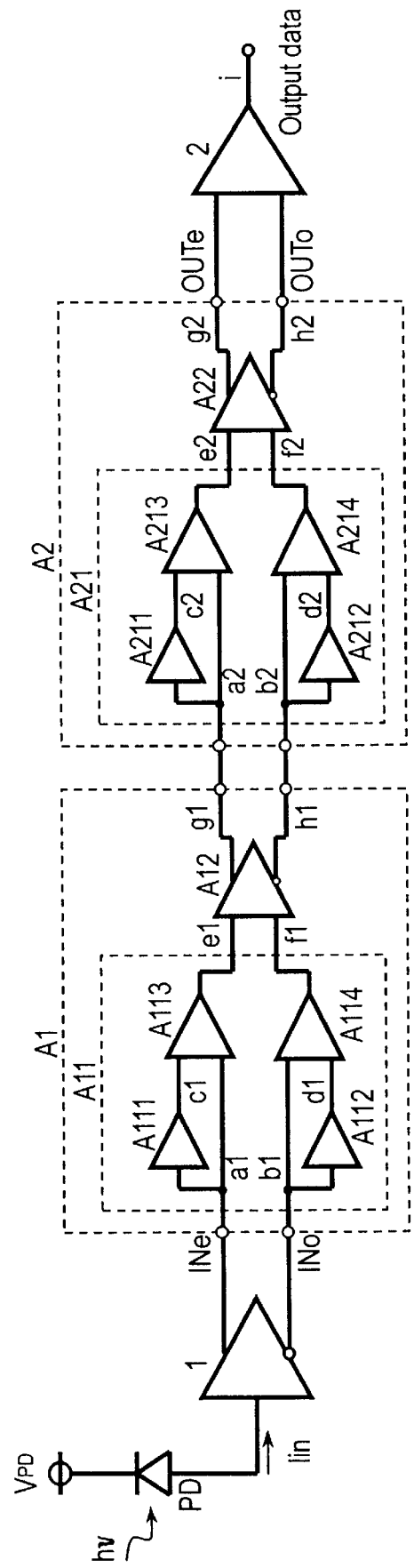
FIG. 6 is a circuit diagram of two-stage constitution in an embodiment of a multi-stage amplifier circuit according to the invention.

FIG. 6 is a circuit diagram showing an example of constitution of an optical receiving circuit using the amplifier circuits connecting two stages of the multi-stage connected amplifier circuits in the second embodiment shown in FIG. 5, and a second basic amplifier circuit A2 is further connected between the basic amplifier circuit A1 and the comparator 2 in the optical receiving circuit explained in FIG. 2.

Figure 7A:
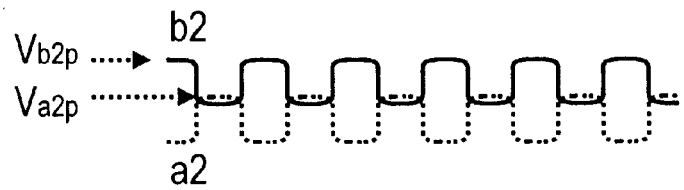
FIG. 7A to FIG. 7E are waveform diagrams in the second embodiment, showing signal waveforms of the optical receiving circuit using the multi-stage amplifier of the two-stage constitution shown in FIG. 6.
Figure 7B:
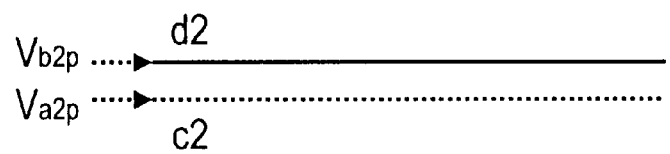
Figure 7C:
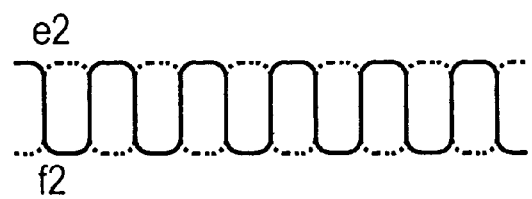
Figure 7D:
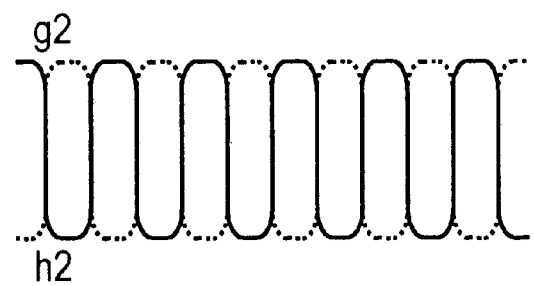
Figure 7E:
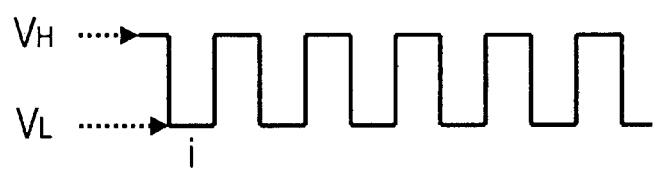

FIG. 7A to FIG. 7D are waveform diagrams showing signal waveforms of parts in the second basic amplifier circuit A2 in the optical receiving circuit shown in FIG. 6, and FIG. 7E is a waveform diagram showing an output signal waveform i of the comparator 2 in FIG. 6.

Input signal waveforms a2 and b2 of the basic amplifier circuit A2 shown in FIG. 7A are input waveforms having an output offset voltage in the first basic amplifier circuit A1, and the DC potentials of a2 and b2 are different as shown in the diagram. Peak values Va2p and Vb2p of the input signal waveforms a2 and b2 are detected and held by the peak detecting and holding circuits A211, A212 in FIG. 6, respectively, and delivered to differential amplifier circuits A213, A214. The output signal waveforms of the peak detecting and holding circuits A211, A212 are c2 and d2 as shown in FIG. 7C.

In FIG. 6, the input waveform a2 and output signal waveform c2 of the peak detecting and holding circuit A211 are supplied into the differential amplifier A213, and a differential output signal e1 is obtained. Similarly, the input waveform b2 and output signal waveform d2 of the peak detecting and holding circuit A212 are supplied into the differential amplifier A214, and a differential output signal f2 is obtained.

Thus obtained output signal waveforms e2, f2 of the differential amplifier circuits A213, A214 are signal waveforms equal in DC level and mutually opposite in phase, regardless of the input signal level as shown in FIG. 7C. The signal waveforms e2 and f2 are amplified by an amplitude limiting amplifier circuit A22 to be signal waveforms g2 and h2 as shown in FIG. 7D.

Finally, the signal waveforms g2, h2 are compared in voltage value by the comparator 2, and issued as a pulse signal data row waveform i that can be distinguished logically.

As clear from the description above, in the optical receiving circuit in FIG. 6, the output offset voltage of the basic amplifier circuit A1 can be compensated by the second basic amplifier circuit A2 in the later stage. Therefore, as mentioned above, when the received input signal level is small, generation of noise shown in FIG. 4A(*b*) or FIG. 4B(*b*) can be prevented, and the minimum reception sensitivity is improved, and a wide input dynamic range can be obtained.

As known from the above, in the multi-stage connection amplifier circuit in the second embodiment shown in FIG. 5, in addition to the same effects as in the first embodiment, it brings about the effects of improving the minimum reception sensitivity and obtaining a wide input dynamic range, by compensating the output offset voltage due to fluctuations of the elements occurring during manufacture of integrated circuits of basic amplifier circuits of each stage or deviation from ideal operation of the elements for composing the basic amplifier circuit, by the basic amplifier circuit of the next stage. Moreover, by cascade connection, the required gain per stage can be decreased, and the required precision of basic amplifier circuit of each stage can be notably alleviated.

Figure 8A:
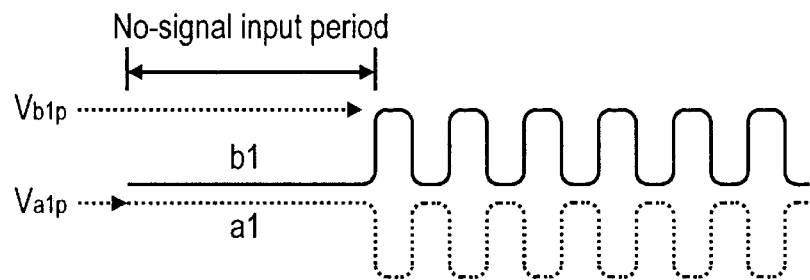
FIG. 8A to FIG. 8E are waveform in diagrams adding waveforms of parts in no-signal input period to signal waveforms of parts of the optical receiving circuit using the basic amplifier circuit in the first embodiment of the invention shown in FIG. 2.
Figure 8B:
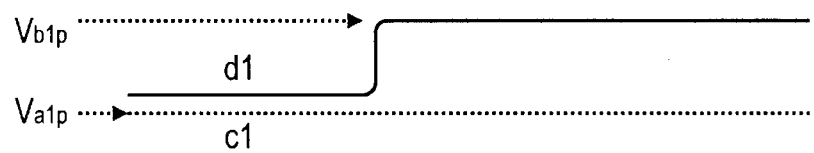
Figure 8C:
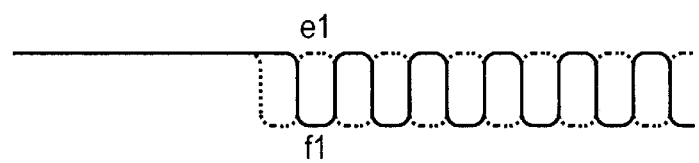
Figure 8D:
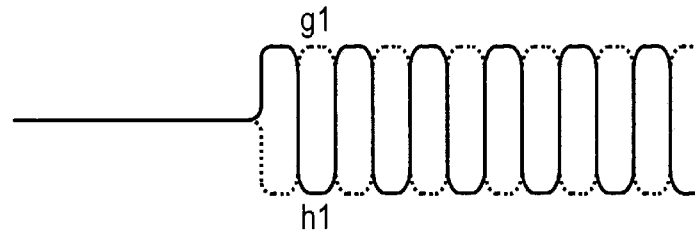
Figure 8E:
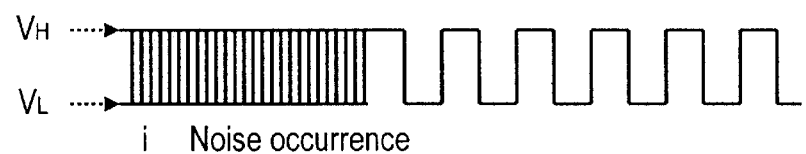

Signal waveforms of each parts in no-signal input period in the optical receiving circuit in FIG. 2 are added to the signal waveforms of parts in FIG. 3A to FIG. 3E, and obtained waveform diagrams are shown in FIG. 8A to FIG. 8E. As shown in FIG. 8C and FIG. 8D, in no-signal input period, voltage levels of e1 and f1, and g1 and h1 are equal to each other, and a code error occurs in the output data as shown in FIG. 8E. This code error in the no-signal input period often causes a problem because it is an interference signal in the case of, for example, extracting clock frequency component from the data.

To solve this problem, a third embodiment of the invention features a basic amplifier circuit having an amplitude limiting amplifier circuit A12 provided with a constant output offset voltage, with the constitution basically same as in the circuit in the first embodiment in FIG. 1.

Figure 9A:
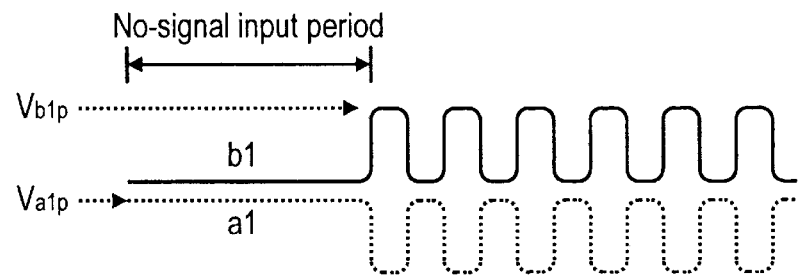
FIG. 9A to FIG. 9E are waveform diagrams in the fourth embodiment, showing signal waveforms of parts of the optical receiving circuit using the multi-stage amplifier of the two-stage constitution shown in FIG. 6.
Figure 9B:
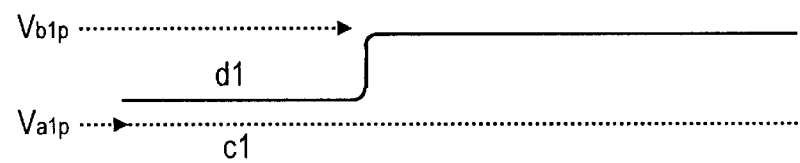
Figure 9C:
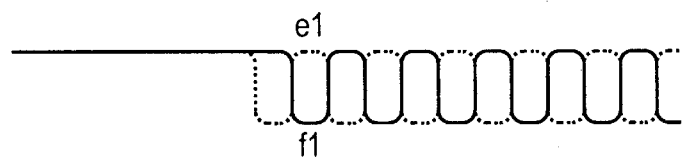
Figure 9D:
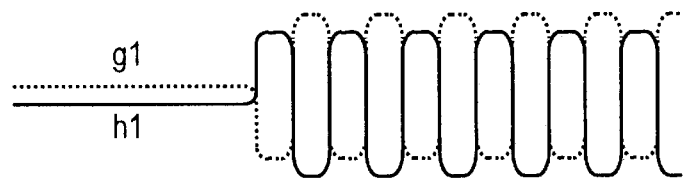
Figure 9E:
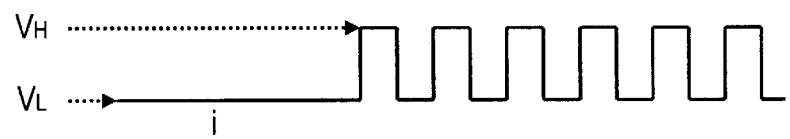

FIG. 9A to FIG. 9D show signal waveforms of parts in the basic amplifier circuit A1 having the amplitude limiting amplifier circuit A12 used in the optical receiving circuit in FIG. 2 provided with the constant output offset voltage as mentioned above, and FIG. 9E shows the output signal waveform of the comparator 2. As shown in FIG. 9D, in no-signal input period, a specific offset is applied between the output signal waveforms g1, h1 of the amplitude limiting amplifier circuit A12, and the output of the comparator 2 is free from code error as shown in FIG. 8E, and logic 0 is always issued. Besides, of course, the same effects as in the first embodiment are obtained.

A fourth embodiment of the invention is similar to the constitution of the circuit of the second embodiment shown in FIG. 5, and a specific output offset voltage is applied to an amplitude limiting amplifier circuit An2 of a basic amplifier circuit An of a final stage, and therefore code error does not occur in no-signal input period and logic 0 is always issued, same as in the effects of the circuit in the third embodiment, and moreover the same effects as in the circuit in the second embodiment are also obtained.

Figure 10A:
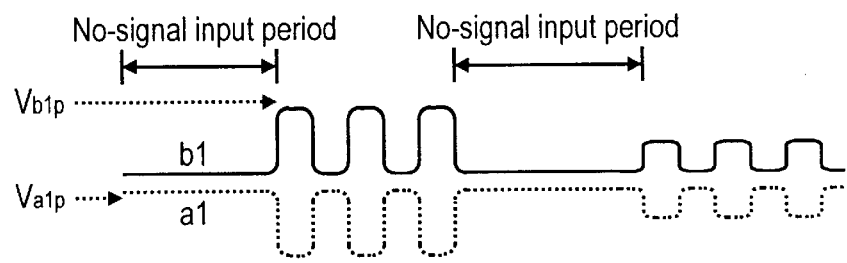
FIG. 10A to FIG. 10E are waveform diagrams of parts in which the input signal is instantly reduced in the optical receiving circuit using the basic amplifier circuit in the first embodiment of the invention shown in FIG. 2.
Figure 10B:
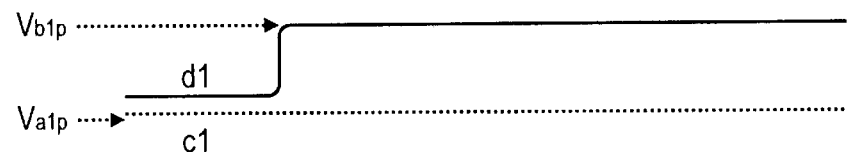
Figure 10C:
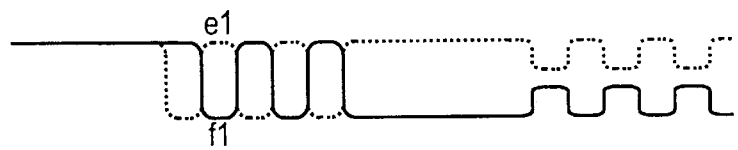
Figure 10D:
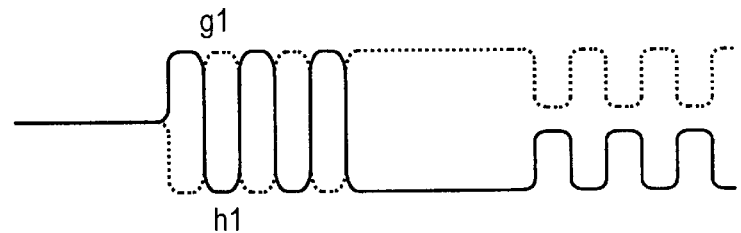
Figure 10E:
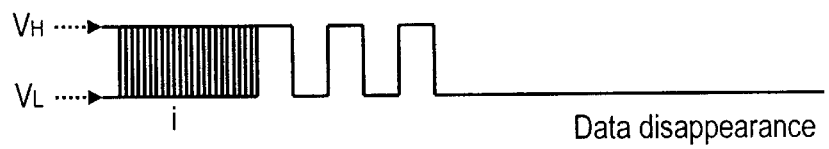

FIG. 10A to FIG. 10E, relating to optical receiving circuit in FIG. 2, are waveform diagrams showing signal waveforms of parts in the case of input of a burst signal small in level with a short interval after a burst signal large in level. Since the peak detecting and holding circuit A112 in FIG. 2 is holding the peak value of a burst signal large in level (FIG. 10B), a burst signal small in level coming right after cannot be reproduced, and the data is lost as shown in FIG. 10E.

Figure 11:
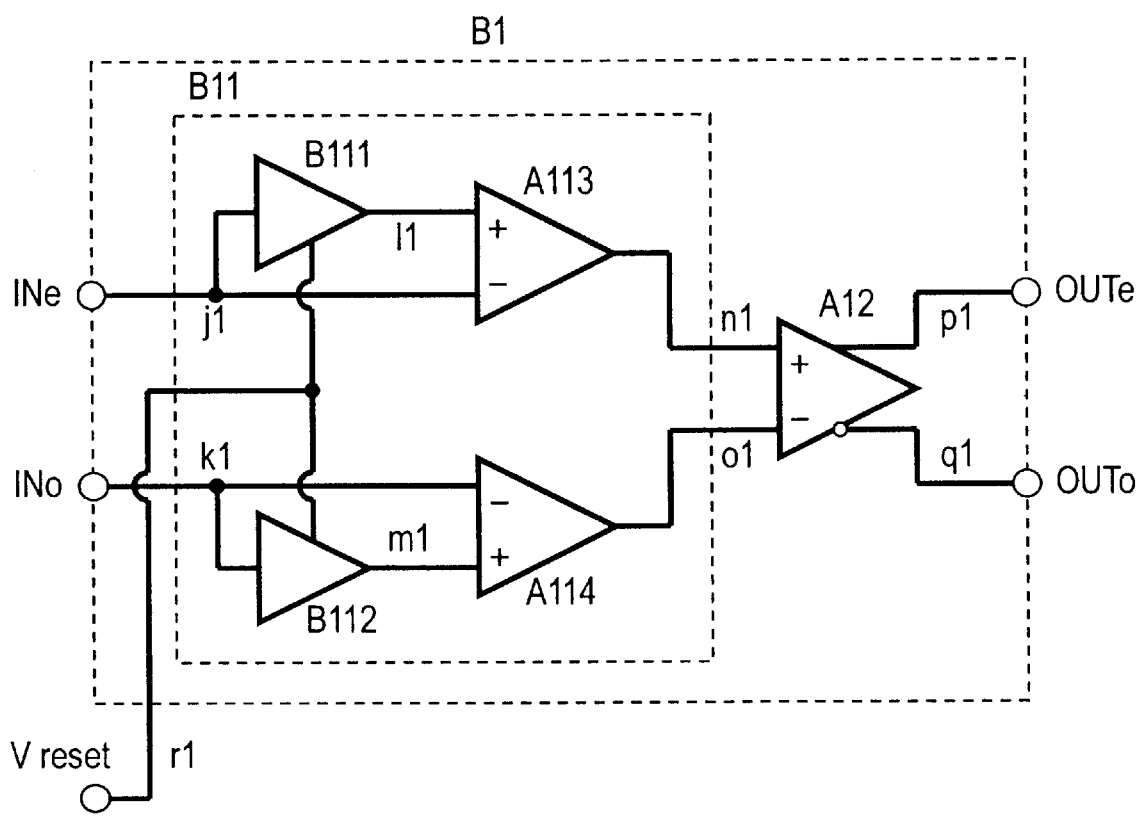
FIG. 11 is a circuit diagram showing a second basic amplifier circuit used in a fifth embodiment and a seventh embodiment of the invention.

To solve this problem, a circuit diagram of a basic amplifier circuit B1 in a fifth embodiment of the invention is shown in FIG. 11. This basic amplifier circuit B1 comprises an input terminal INe for receiving one signal of differential input signals, an input terminal INo for receiving other signal, an offset compensation circuit B11 for equalizing and issuing a DC value in data input period of the voltage signal entered in one input terminal INe and a DC value in data input period of the voltage signal entered in other input terminal INo, an amplitude limiting amplifier A12 for keeping constant the amplitude of the output signals while amplifying in a linear region by receiving the differential output signals from this offset compensation circuit B11 as input signals, an output terminal OUTe for delivering one signal of the differential output signals, and output terminal OUTo for delivering other signal.

The offset compensation circuit B11 is composed of one peak detecting and holding circuit B111 for detecting and holding the peak value of the voltage signal entered in one input terminal INe, a first differential amplifier circuit A113 for issuing the difference of the value detected and held by this peak detecting and holding circuit B111 and the voltage signal entered in one input terminal INe, and a second peak detecting and holding circuit B112 for detecting and holding the peak value of the voltage signal entered in other input terminal INo, and a second differential amplifier circuit A114 for issuing the difference of the value detected and held by this second peak detecting and holding circuit B112 and the voltage signal entered in other input terminal INo.

The first peak detecting and holding circuit B111 and second peak detecting and holding circuit B112 have a common reset signal terminal Vreset on the outside, and by the signal applied to this reset terminal Vreset, the input signal and output signal in the peak detecting and holding circuits B111, B112 are nearly same in potential.

Figure 12:
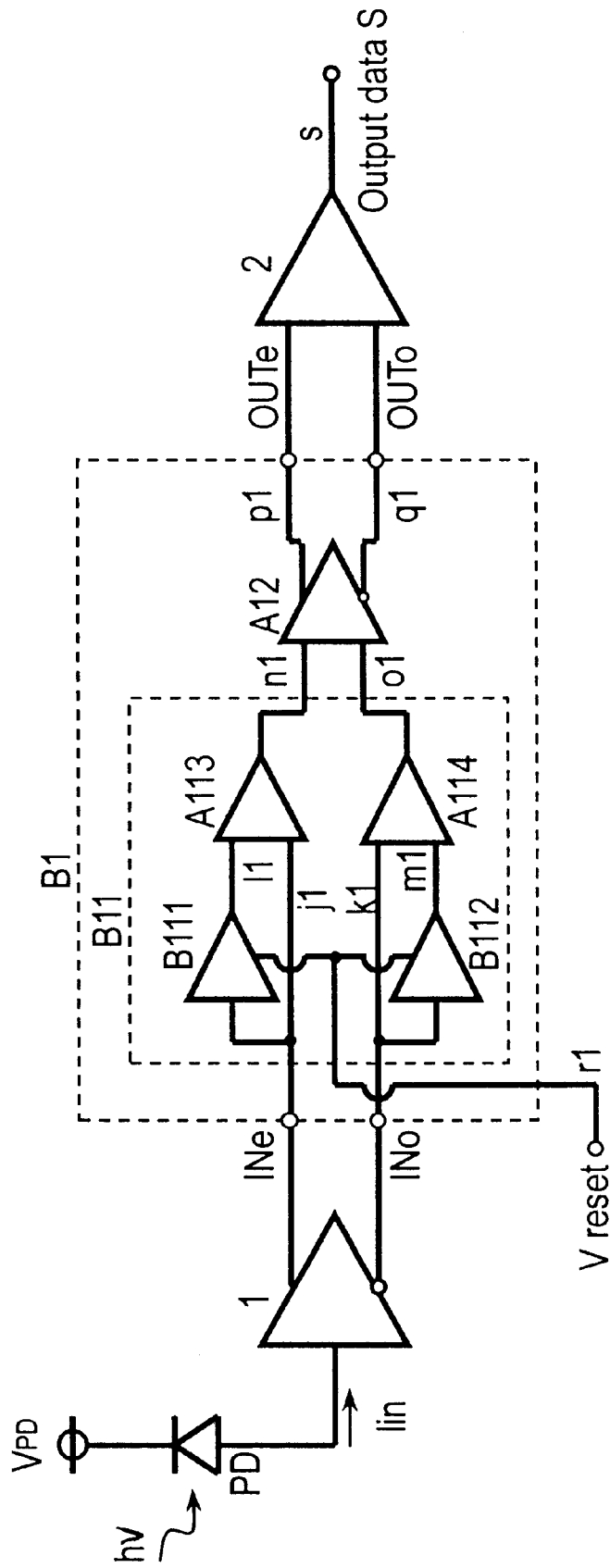
FIG. 12 is a waveform diagram showing signal waveforms of parts in the optical receiving circuit using the second basic amplifier circuit shown in FIG. 11.

FIG. 12 is a circuit diagram showing an example of constitution of the optical receiving circuit using the basic amplifier circuit B1 in the fifth embodiment shown in FIG. 11. In FIG. 12, a photo detector PD (photo diode) converts an optical signal h v into a current signal Iin, and this current signal Iin is issued to the differential output type pre-amplifier circuit 1. The differential output type pre-amplifier circuit 1 converts the current signal Iin into voltage signals of positive phase and reverse phase, and amplifies. The output end of the differential output type pre-amplifier circuit 1 is connected to input terminals INe and INo of the basic amplifier circuit B1, and the output terminals OUTe and OUTo of the basic amplifier circuit B1 are connected to the input end of the comparator 2. The comparator 2 compares the voltage values of voltage signals equal in DC potential and mutually opposite in phase, being amplified and issued from the basic amplifying circuit B1, and issues a pulse signal data row that can be distinguished logically.

Figure 13A:
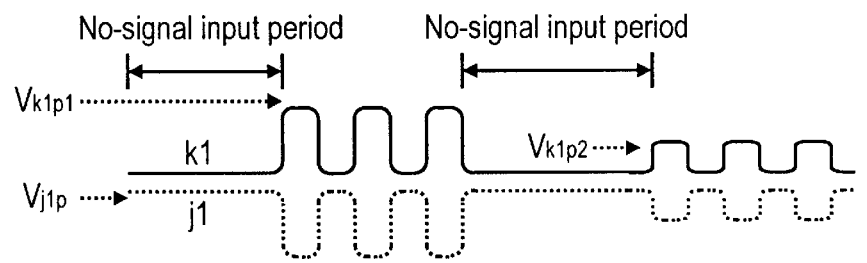
FIG. 13A to FIG. 13F are circuit diagrams of multi-stage amplifier circuit composed by connecting the second basic amplifier circuits in multiple stages.
Figure 13B:
Figure 13C:
Figure 13D:
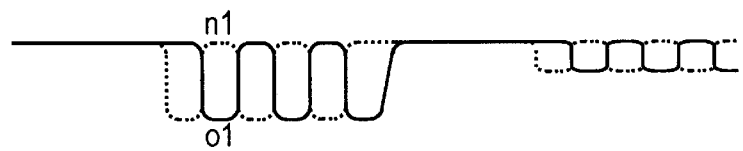
Figure 13E:
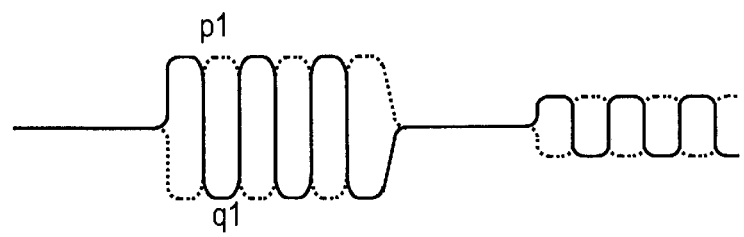
Figure 13F:
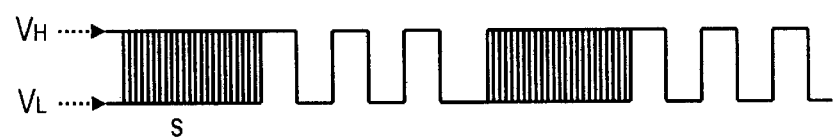

In the optical receiving circuit in FIG. 12, when a burst signal small in level is entered with a short interval after a burst signal large in level, the signal waveforms of parts in the basic amplifier circuit B1 are shown in FIG. 13A to FIG. 13E, and the output signal waveform i of the comparator 2 is shown in FIG. 13F.

Peak values of input signal waveforms j1 and k1 shown in FIG. 13A are detected and held respectively in the peak detecting and holding circuits B111 and B112 in FIG. 12, and issued to the differential amplifier circuits A113, A114 respectively. The output signal waveforms of the peak detecting and holding circuits B111 and B112 are l1 and m1 shown in FIG. 13C, respectively.

In the case of a burst signal small in level following with a no-signal input period after a burst signal large in level as in FIG. 13A, in the second peak detecting and holding circuit B112 in FIG. 12, first, the peak value Vk1p1 of the preceding burst signal large in level of the signal waveform k1 is detected and held, but in the no-signal input period between burst signals, by feeding a reset signal r1 in the reset terminal Vreset so that the input signal voltage and output signal voltage of the second peak detecting and holding circuit B112 may be equalized, the peak value Vk1p2 of next burst signal small in level can be accurately detected and held.

In FIG. 13A, the peak value of the input signal waveform j1 is not changed between the previous burst and next burst, but supply voltage fluctuations or variations of bias light in the light emitting unit may be considered, and therefore in the first peak detecting and holding circuit B111, same as in the second peak detecting and holding circuit B112, it is necessary to equalize the input signal voltage and output signal voltage by the reset signal r1.

In FIG. 12, the output signal l1 and input signal j1 of the first peak detecting and holding circuit B111 are supplied into the differential amplifier circuit A113, and the output signal m1 and input signal k1 of the second peak detecting and holding circuit B112 are supplied into the differential amplifier circuit A114. The output signal waveforms of the differential amplifier circuits A113, A114 are n1 and o1, respectively, as shown in FIG. 13D.

The signal waveforms n1 and o1 are amplified by the amplitude limiting amplifier circuit A12, and become signal waveforms p1 and q1 as shown in FIG. 13E. The signal waveforms p1, q1 are compared of voltage by the comparator 2, and are issued as a pulse signal data waveform s (FIG. 13F) that can be distinguished logically.

Thus, in each burst period, DC levels of n1 and o1, and p1 and q1 are equal to each other, respectively, and it is possible to reproduce a burst signal small in level entered with a short interval after a burst signal large in level. Of course, in the optical receiving circuit using the basic amplifier circuit B1 in the fifth embodiment, the same effects as in the circuit in the first embodiment are obtained.

Figure 14:
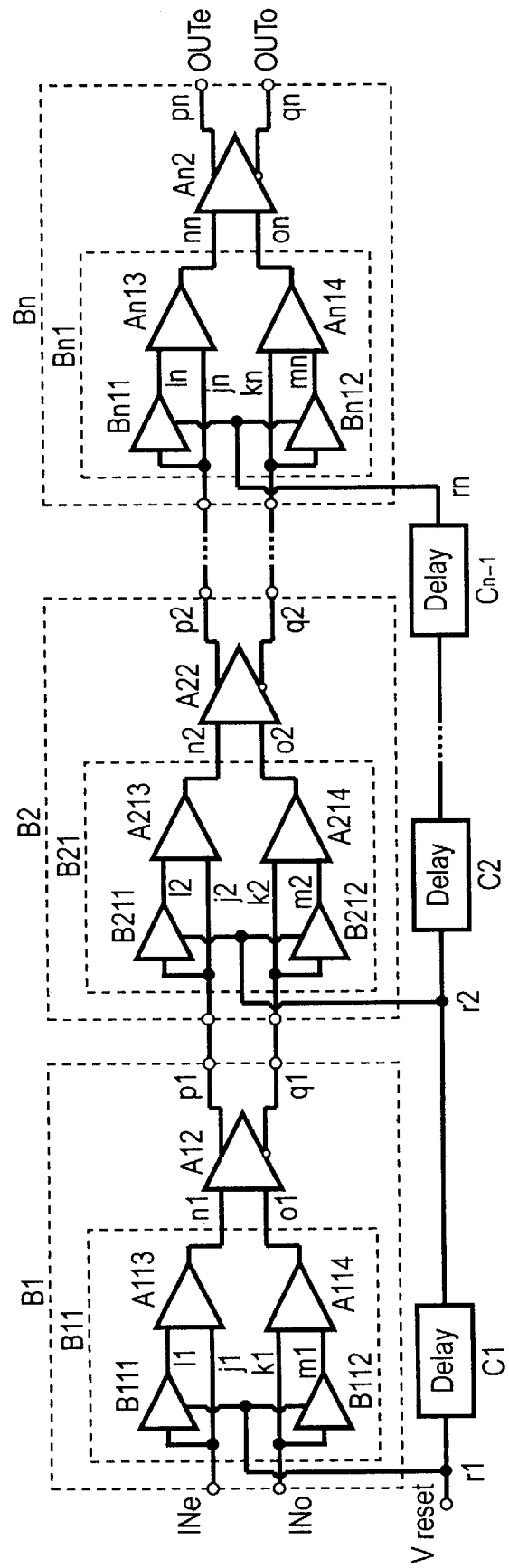
FIG. 14 is a circuit diagram showing an amplifier circuit in a sixth embodiment of the invention.
Figure 15A:
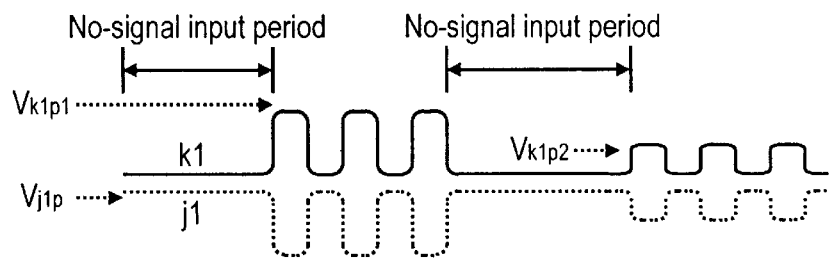
FIG. 15A to FIG. 15F are waveform diagrams in the seventh embodiment showing signal waveforms of parts of the optical receiving circuit shown in FIG. 12.
Figure 15B:
Figure 15C:
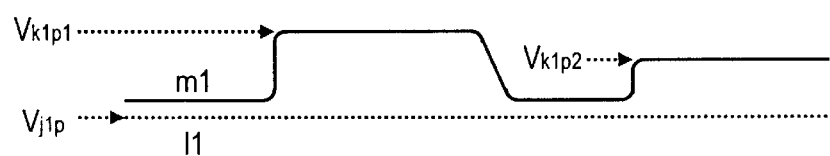
Figure 15D:
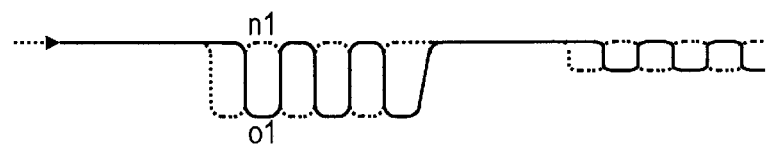
Figure 15E:
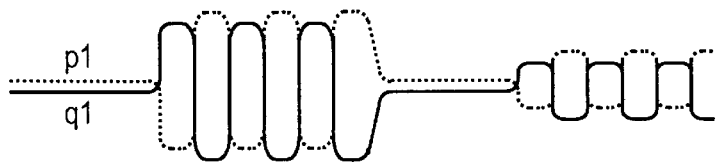
Figure 15F:
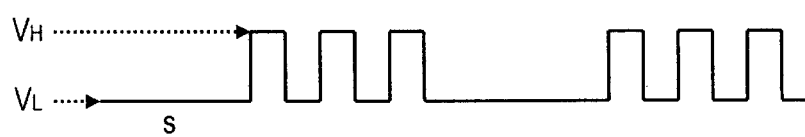
Figure 16:
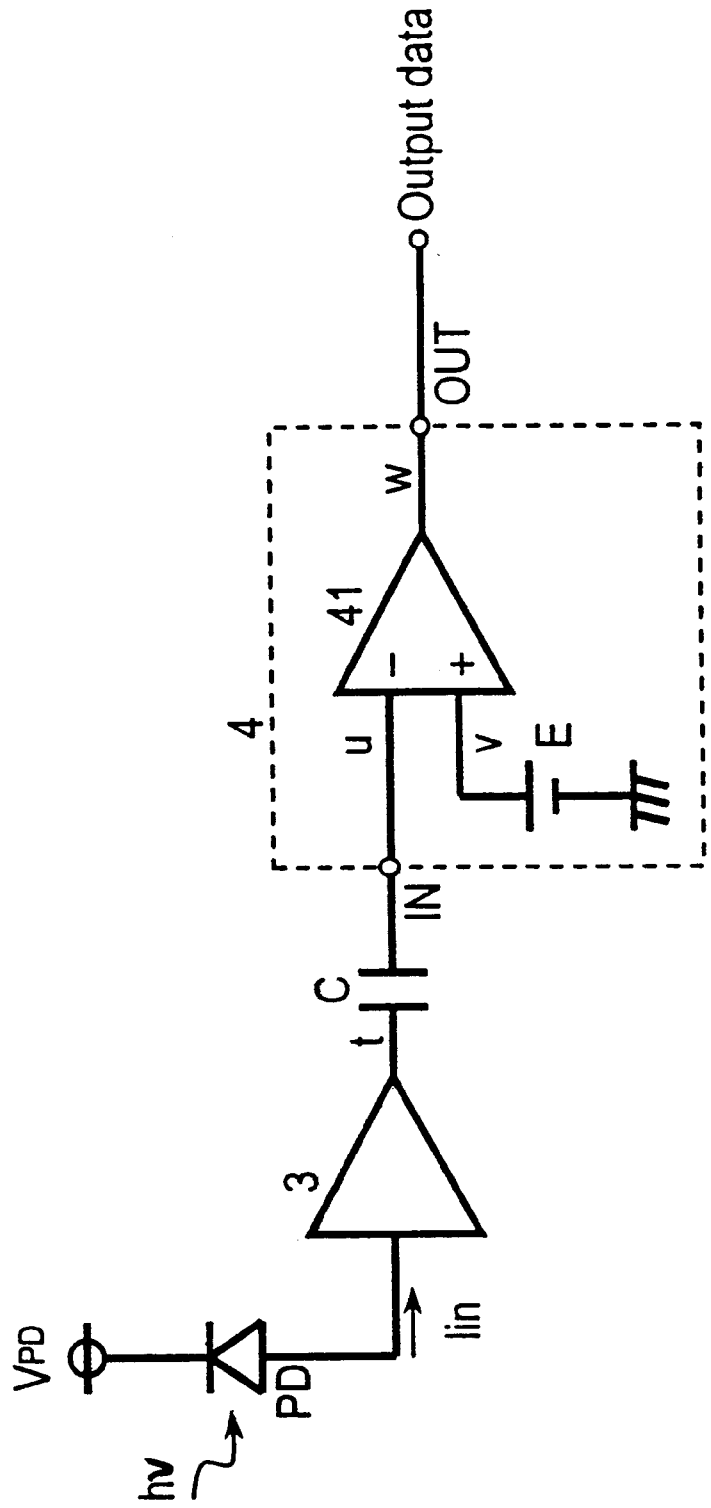
FIG. 16 is a circuit diagram showing a conventional optical receiving circuit.
Figure 17A:
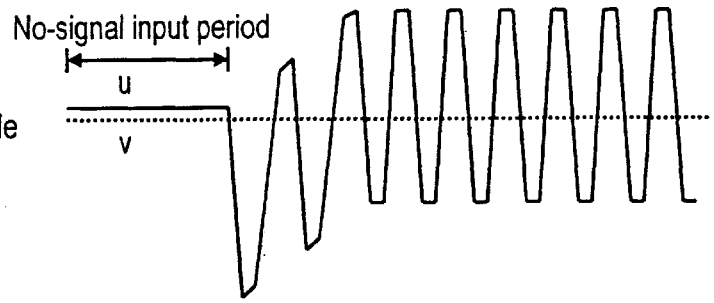
FIG. 17A and FIG. 17B are input signal waveform and output data waveform of an amplitude limiting amplifier circuit upon start of data input by setting the low band cut-off frequency at high value in the conventional optical receiving circuit.
Figure 17B:
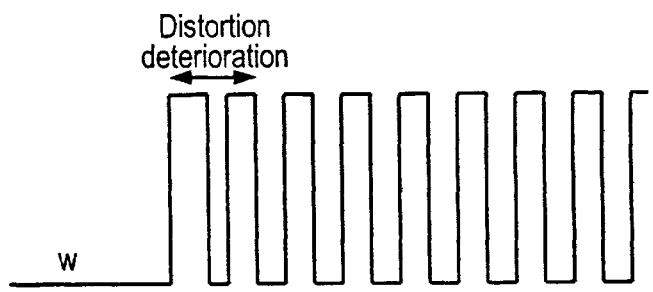
Figure 18A:
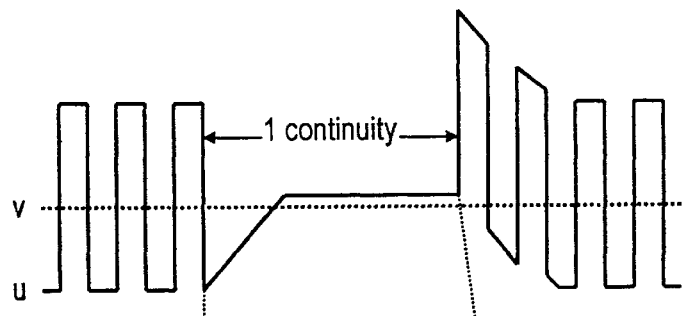
FIG. 18A and FIG. 18B are input signal waveform and output data waveform of an amplitude limiting amplifier circuit in single continuity mode by setting the low band cut-off frequency at high value in the conventional optical receiving circuit.
Figure 18B:
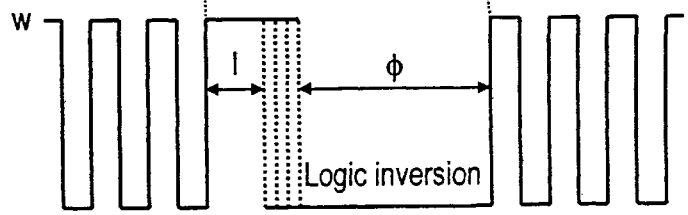
Figure 19A:
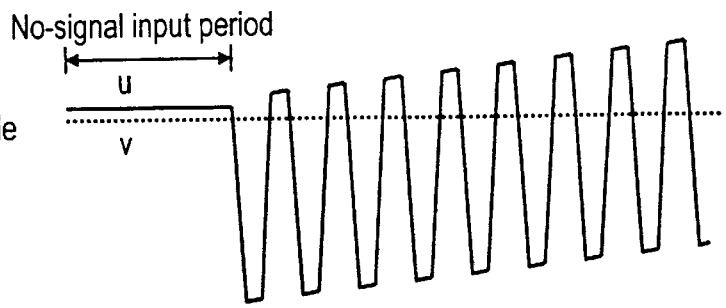
FIG. 19A and FIG. 19B are input signal waveform and output data waveform of an amplitude limiting amplifier circuit upon start of data input by setting the low band cut-off frequency at low value in the conventional optical receiving circuit.
Figure 19B:
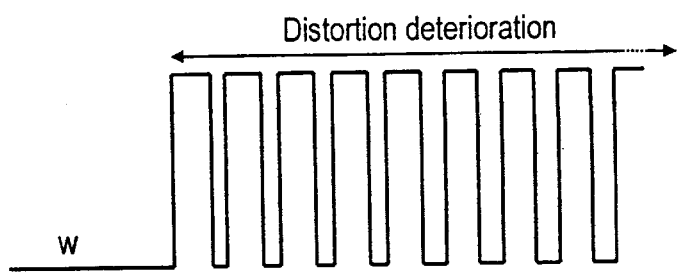
Figure 20A:
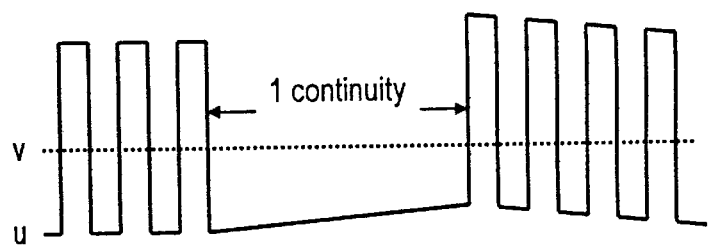
FIG. 20A and FIG. 20B are input signal waveform and output data waveform of an amplitude limiting amplifier circuit in single continuity mode by setting the low band cut-off frequency at low value in the conventional optical receiving circuit.
Figure 20B:
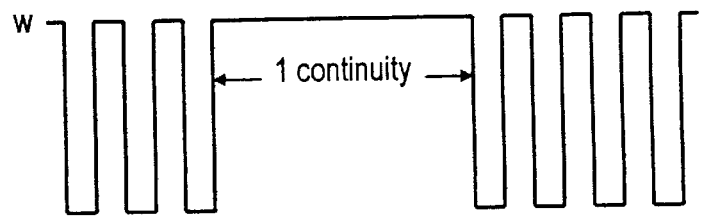

FIG. 14 is a circuit diagram showing an amplifier circuit in a sixth embodiment of the invention. The amplifier circuit in FIG. 14 is composed by cascade connection of n stages of basic amplifier circuit B1 to Bn in the same constitution as the basic amplifier circuit B1 in the fifth embodiment shown in FIG. 11, and delay circuits C1 to Cn−1 are added between reset signal terminals Vreset of the basic amplifier circuits B1 to Bn, and the reset signal terminal of the basic amplifier circuit B1 of the first stage is used as the entire reset signal terminal Vreset.

If all stages of cascade connection are reset simultaneously, the output of the circuit of each stage changes at the same time, and hence the second and subsequent stage circuits have effects of the response characteristic of the preceding stage output, and possibly correct reset may not be done, and hence in order to reset sequentially from the first stage, the delay circuits C1 to Cn−1 are inserted to reset each stage correctly to initial state.

The multi-stage connection amplifier circuit in FIG. 14 in the sixth embodiment of the invention thus constituted has the same effects as in the circuit of the second embodiment in FIG. 5 and also has the same effects as the circuit of the fifth embodiment in FIG. 11.

A seventh embodiment of the invention is similar in the basic constitution to the constitution of the fifth embodiment shown in FIG. 11, except that a specific output offset voltage is provided in the amplitude limiting amplifier circuit A12 in the basic amplifier circuit.

In the optical receiving circuit using the basic amplifying circuit of the seventh embodiment as the basic amplifying circuit B1 shown in FIG. 12, signal waveforms of parts are shown in FIG. 15A to FIG. 15F. As clear from the output data waveforms shown in FIG. 15F, in no-signal input period, code error does not occur, and always logic 0 is delivered, which are same effects as in the circuit of the third embodiment, and moreover it also has the same effects as in the circuit of the fifth embodiment, that is, a burst signal small in level entered with a short interval after a burst signal large in level can be reproduced.

An eighth embodiment of the invention is similar in the basic constitution to the constitution of the sixth embodiment in FIG. 14, and moreover by applying a specific output offset voltage to the amplitude limiting amplifier circuit An2 of the basic amplifier circuit Bn in the final stage in the basic amplifier circuits B1 to Bn of cascade connection of n stages, the same effects as in the circuit of the third embodiment and the circuit of the fifth embodiment are obtained, that is, in no-signal input period, code error does not occur, and always logic 0 is delivered.

Certain preferred embodiments of the invention are described herein, and the operation and function are specifically explained, and according to the amplifier circuit unit and the amplifier circuit of the invention, by installing an amplitude limiting amplifier circuit for receiving the differential output signal of the offset compensation circuit as input signal, and keeping the output signal amplitude constant while amplifying after the offset compensation circuit for detecting and holding the peak values of normal phase and reverse phase of differential input signal waveform, and issuing the difference of the positive phase input signal and its peak value and the difference of reverse phase input signal and its peak value, both high speed response characteristic upon start of data input and same code continuity tolerance can be both established, so that an amplifier circuit for optical receiving circuit capable of following up at high speed the signal level changing instantly can be presented.

It must be noted that modified examples of the illustrated embodiments herein are also included in the scope of the claims of the invention.

What is claimed is:

1. An amplifier circuit unit comprising:
   offset compensation circuit means composed of a first peak detecting and holding circuit for receiving a positive phase input signal of differential input signals, a second peak detecting and holding circuit for receiving a reverse phase input signal of said differential input signals, a first differential amplifier circuit for receiving said positive phase input signal and an output signal of said first peak detecting and holding circuit, and issuing their difference, and a second differential amplifier circuit for receiving said reverse phase input signal and an output signal of said second peak detecting and holding circuit, and issuing their difference, and
   amplitude limiting amplifying circuit means for receiving an output signal of said first differential amplifier circuit and an output signal of said second differential amplifier circuit, and issuing a signal of a specific amplitude.

2. An amplifier circuit unit of claim 1, wherein said amplitude limiting amplifier circuit means has a specific output offset voltage.

3. Amplifier circuit means characterized by cascade connection of plural stages of the amplifier circuit units of claim 1.

4. The amplifier circuit of claim 3,
   wherein said amplitude limiting amplifier circuit means has a specific output offset voltage, and
   wherein said amplitude limiting amplifier circuit means is used in a final stage of the cascade connection of plural stages of the amplifier circuit units.

5. An amplifier circuit unit of claim 1, wherein said first peak detecting and holding circuit and said second peak detecting and holding circuit for composing said offset compensation circuit means have reset signal terminals, and by the signals applied to said reset signal terminals, the input signal and output signal of the first peak detecting and holding circuit and the input signal and output signal of the second peak detecting and holding circuit are nearly at same potential.

6. An amplifier circuit unit of claim 5, wherein said amplitude limiting amplifier circuit means has a specific output offset voltage.

7. Amplifier circuit means characterized by cascade connection of plural stages of the amplifier circuit units of claim 5, wherein delay circuits are provided between said rest signal terminals of the amplifier circuit units in cascade connection, and it is constituted so that the reset signal applied to the reset terminal of the amplifier circuit unit of the first stage is supplied to the amplifier circuit units of the second stage and later through each delay circuit.

8. The amplifier circuit of claim 7,
   wherein said amplitude limiting amplifier circuit means has a specific output offset voltage, and
   wherein said amplitude limiting amplifier circuit means is used in a final stage of the cascade connection of plural stages of the amplifier circuit units.

* * * * *